United States Patent
Yeh et al.

(10) Patent No.: US 8,394,692 B2
(45) Date of Patent: Mar. 12, 2013

(54) INTEGRATING A FIRST CONTACT STRUCTURE IN A GATE LAST PROCESS

(75) Inventors: Chiung-Han Yeh, Tainan (TW); Ming-Yuan Wu, Hsinchu (TW); Kong-Beng Thei, Pao-Shan Village (TW); Harry Chuang, Hsinchu (TW); Mong-Song Liang, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/286,276

(22) Filed: Nov. 1, 2011

(65) Prior Publication Data

US 2012/0045889 A1    Feb. 23, 2012

Related U.S. Application Data

(62) Division of application No. 12/839,994, filed on Jul. 20, 2010, now Pat. No. 8,093,120, which is a division of application No. 12/341,891, filed on Dec. 22, 2008, now Pat. No. 8,035,165.

(60) Provisional application No. 61/091,933, filed on Aug. 26, 2008.

(51) Int. Cl.
*H01L 21/8238* (2006.01)
(52) U.S. Cl. .. 438/199; 438/197; 438/523; 257/E21.632
(58) Field of Classification Search .................. 438/197, 438/199, 523, 573, 575; 257/E21.632
See application file for complete search history.

(56) References Cited

U.S. PATENT DOCUMENTS

| | | | |
|---|---|---|---|
| 6,072,221 A | 6/2000 | Hieda | |
| 7,378,713 B2 | 5/2008 | Hsu et al. | |
| 7,381,608 B2 | 6/2008 | Brask et al. | |
| 7,381,649 B2 | 6/2008 | Chen et al. | |
| 7,384,880 B2 | 6/2008 | Brask et al. | |
| 8,093,120 B2 * | 1/2012 | Yeh et al. | 438/199 |
| 2006/0019033 A1 | 1/2006 | Muthukrishnan et al. | |
| 2008/0157155 A1 | 7/2008 | Wang | |
| 2009/0014796 A1 | 1/2009 | Liaw | |
| 2009/0152651 A1 | 6/2009 | Bu et al. | |
| 2009/0194825 A1 | 8/2009 | Werner et al. | |

FOREIGN PATENT DOCUMENTS

CN    1979838    6/2007

OTHER PUBLICATIONS

Chinese Patent Office, Office Action dated Jan. 10, 2011, Application No. 200910170465.0, 4 pages.

* cited by examiner

*Primary Examiner* — Hoai V Pham
(74) *Attorney, Agent, or Firm* — Haynes and Boone, LLP

(57) ABSTRACT

A method is provided that includes providing a substrate; forming a transistor in the substrate, the transistor having a dummy gate; forming a dielectric layer over the substrate and transistor; forming a contact feature in the dielectric layer; and after forming the contact feature, replacing the dummy gate of the transistor with a metal gate. An exemplary contact feature is a dual contact.

9 Claims, 18 Drawing Sheets

INTEGRATING A FIRST CONTACT STRUCTURE IN A GATE LAST PROCESS

This application is a divisional of U.S. patent application Ser. No. 12/839,994, filed Jul. 20, 2010, which is a divisional of U.S. patent application Ser. No. 12/341,891, filed Dec. 22, 2008, now U.S. Pat. No. 8,035,165, issued Oct. 11, 2011, which claims the benefit to U.S. Provisional Patent Application Ser. No. 61/091,933, filed Aug. 26, 2008, the entire disclosures of which are incorporated herein by reference.

BACKGROUND

The present disclosure relates generally to forming an integrated circuit device on a substrate and, more particularly, to integrating a first contact structure in a gate last process.

Semiconductor device geometries continue to dramatically decrease in size since such devices were first introduced several decades ago. Today's fabrication plants are routinely producing devices having feature dimensions less than 65 nm. However, solving the problems associated with implementing new process and equipment technology while continuing to satisfy device requirements has become more challenging. For example, metal-oxide-semiconductor (MOS) transistors have typically been formed with polysilicon gate electrodes. Polysilicon material has been used due to its thermal resistive properties during high temperature processing, which allows it to be annealed at high temperatures along with source/drain structures. Furthermore, polysilicon's ability to block the ion implantation of doping atoms into the channel region is advantageous, as it allows for the easy formation of self aligned source/drain structures after gate patterning is completed.

In some IC designs, there has been a desire to replace the polysilicon gate electrode with a metal gate electrode to improve device performance as feature sizes continue to decrease. A gate last process may be implemented to address the concerns of high temperature processing on metal materials. In a gate last process, a dummy poly gate is initially formed and may continue with processing until deposition of an interlayer dielectric (ILD). The dummy poly gate may then be removed and replaced with a metal gate. However, problems arise when integrating a gate last process with other fabrication processes such as formation of a first contact structure.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1A:
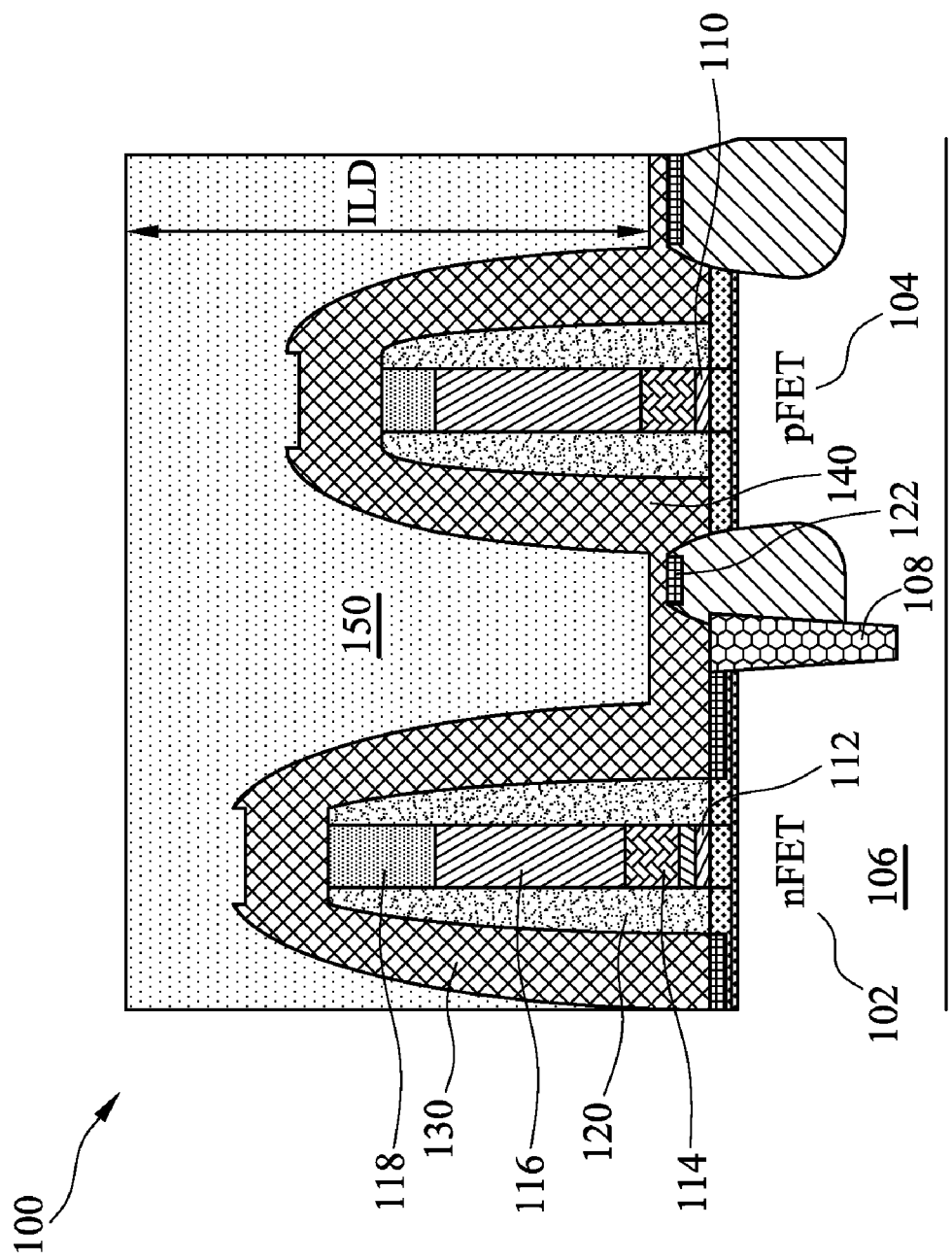
FIGS. 1A to 1F are cross-sectional views of a semiconductor device at various stages of fabrication in a gate last process.

The following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Referring to FIGS. 1A to 1F, illustrated are cross-sectional views of a semiconductor device 100 at various stages of fabrication in a gate last process. In FIG. 1A, the semiconductor device 100 may include regions 102 and 104 in which an N-channel field effect transistor (nFET) and P-channel FET (pFET) may be formed, respectively. It is understood that part of the semiconductor device 100 may be fabricated by complementary metal-oxide-semiconductor (CMOS) technology process flow, and thus some processes are only briefly described herein. Further, the semiconductor device 100 may include various other devices and features, such as other types of transistors such as bipolar junction transistors, resistors, capacitors, diodes, fuses, etc., but is simplified for a better understanding of the inventive concepts of the present disclosure.

The semiconductor device 100 may include a semiconductor substrate 106 such as a silicon substrate. The substrate 106 may include various doping configurations depending on design requirements as is known in the art. The substrate 106 may also include other elementary semiconductors such as germanium and diamond. Alternatively, the substrate 106 may include a compound semiconductor and/or an alloy semiconductor. Further, the substrate 106 may optionally include an epitaxial layer (epi layer), may be strained for performance enhancement, and may include a silicon-on-insulator (SOI) structure.

The semiconductor device 100 may further include an isolation structure 108 such as a shallow trench isolation (STI) feature formed on the substrate 106 for isolating the active regions in the substrate as is known in the art. The isolation structure may be formed of silicon oxide, silicon nitride, silicon oxynitride, fluoride-doped silicate glass (FSG), and/or a low-k dielectric material known in the art.

The nFET 102 and pFET 104 devices may each include a gate dielectric layer 110 including an interfacial layer/high-k dielectric layer formed over the substrate 106. The interfacial layer may include a silicon oxide layer ($SiO_2$) or silicon oxynitride (SiON) having a thickness ranging from about 5 to about 10 angstroms (Å) formed on the substrate 106. The high-k dielectric layer may be formed on the interfacial layer by atomic layer deposition (ALD) or other suitable technique. The high-k dielectric layer may include a thickness ranging from about 10 to about 40 angstroms (Å). The high-k dielectric layer may include hafnium oxide ($HfO_2$). Alternatively, the high-k dielectric layer may optionally include other high-k dielectrics, such as $TiO_2$, HfZrO, $Ta_2O_3$, $HfSiO_4$, $ZrO_2$, $ZrSiO_2$, combinations thereof, or other suitable material. Further, the high-k gate dielectric layer may include a multiple layer configuration such as $HfO_2/SiO_2$ or $HfO_2/SiON$.

The nFET 102 and pFET 104 devices may each further include a capping layer 112 for tuning a work function of a metal layer (for the gate electrode) for properly performing as an nFET and pFET, respectively. For example, the capping layer 112 may include $Al_2O_3$, $La_2O_3$, LaSiO, TiAlN, TaN, TaC, TiN, TaSi, TiAl, combinations thereof, or other suitable material. The capping layer may be formed on or underneath the high-k dielectric layer. The capping layer may be formed by ALD, CVD, or PVD.

The nFET 102 and pFET 104 devices may each further include a metal gate layer 114 formed over the gate dielectric layer 110. The metal gate layer 114 may include a thickness ranging from about 10 to about 200 angstroms (Å). The metal gate layer 114 may be formed by various deposition techniques, such as chemical vapor deposition (CVD), physical vapor deposition (PVD or sputtering), plating, or other suitable technique. The metal gate layer 114 may include an N work function metal (N-metal) or P work function metal (P-metal) depending on the type of transistor. The metal gate layer 114 may include TiN, TaN, $ZrSi_2$, $MoSi_2$, $TaSi_2$, $NiSi_2$, WN, or other suitable material. The devices 102, 104 may each further include a dummy polysilicon or poly layer 116 formed on the metal gate layer 114 by a deposition or other suitable process. The dummy poly layer 116 may include a thickness ranging from 400 to about 800 angstroms (Å). The devices 102, 104 may each further include a hard mask 118 formed over the dummy poly layer 116. The hard mask 118 may be formed by a deposition process or other suitable process. The hard mask 118 may include silicon nitride, silicon oxynitride, silicon carbide, or other suitable material. The hard mask 118 may include a thickness ranging from about 100 to about 300 angstroms (Å). Sidewall spacers 120 may be formed on either side of the gate stack as is known in the art. The sidewall spacers may include silicon nitride, silicon oxide, or silicon oxynitride.

The nFET 102 and pFET 104 devices may each further include source/drain regions including lightly doped source/drain regions and heavy doped source/drain regions. The source/drain regions may be formed by implanting p-type or n-type dopants or impurities into the substrate 106 depending on the configuration of the transistors 102, 104. The dummy poly gates and source/drain structures may be formed by methods including thermal oxidation, polysilicon deposition, photolithography, ion implantation, etching, and various other methods. The transistors 102, 104 may further include silicide features 122 formed on the source/drain regions by a salicide (self-aligned silicide) process to form a contact. The silicide features 122 may include nickel silicide, cobalt silicide, tungsten silicide, tantalum silicide, titanium silicide, platinum silicide, erbium silicide, palladium silicide, or combinations thereof.

After formation of the various microelectronic devices and structures discussed above, a stressed layer may be formed over the substrate 106. For example, a tensile-contact etch stop layer (T-CESL) 130 may be formed over the nFET device 102, and a compressive-CESL (C-CESL) 140 may be formed over the pFET device 104. The T-CESL 130 and C-CESL 140 may be formed of silicon nitride, silicon oxynitride, and/or other suitable materials. A dielectric layer such as an inter-layer (or level) dielectric (ILD) layer 150 may be formed overlying the T-CESL 130 and C-CESL 140 by chemical vapor deposition (CVD), high density plasma CVD (HDP-CVD), spin-on, physical vapor deposition (PVD or sputtering), or other suitable methods. The ILD layer 150 may include silicon oxide, silicon oxynitride, or a low-k material.

In a gate last process, the dummy poly gate structures 116 of the devices 102, 104 may be removed and replaced with metal gate structures as discussed below.

Figure 1B:
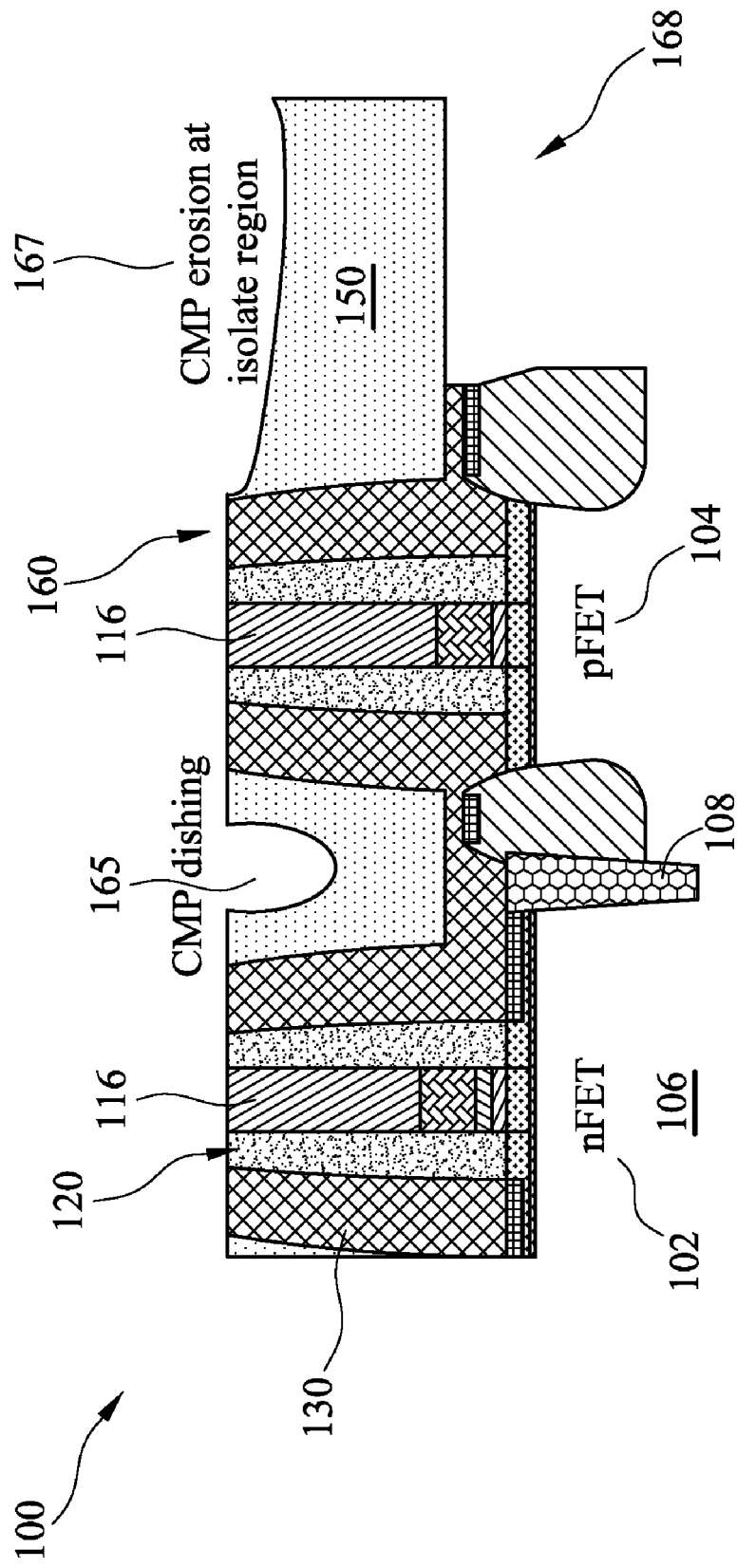

In FIG. 1B, a portion of the ILD layer 150 may be removed and planarized by a chemical mechanical polishing (CMP) process 160 (e.g., first ILD CMP process) until a top portion of the dummy poly gate structures 116 is reached. However, it has been observed that following the ILD CMP process 160 there may be some dishing (e.g., chemical effect) in a region between the devices 102, 104 such that a void 165 may be formed. Further, the ILD CMP process 160 may cause some erosion 167 at a region 168 of the substrate 106 due to the different pattern structures and densities in the region of the devices 102, 104 as compared to the region 168. In other words, the region 168 may include none or a few devices or structures formed therein (e.g., low pattern density) as compared to the region where the devices 102, 104 are formed (e.g., high pattern density).

Figure 1C:
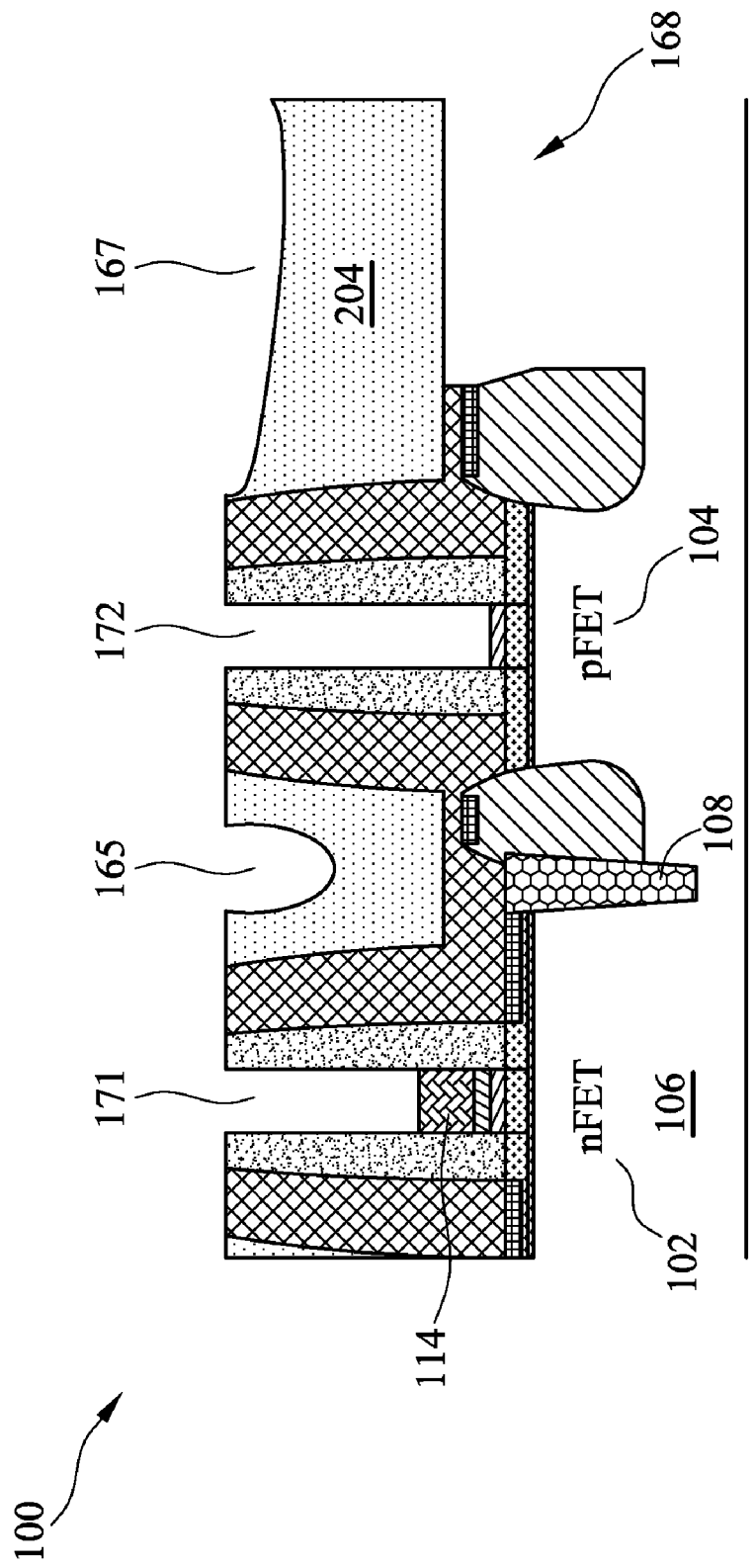

In FIG. 1C, the dummy poly gate structures 116 may be removed in both the nFET 102 and pFET 104 device by an etch back process or other suitable process. Further, the metal gate layer 114 in the pFET device 104 may be removed by an etch process so that a P-metal may be re-deposited. It should be noted that the metal gate layer 114 in the nFET device 102 may remain and perform as an N-metal. Accordingly, the process may be considered as a hybrid process including a gate first flow to form the metal gate of the nFET device and a gate last flow to form the metal gate of the pFET device. In other embodiments, both the metal gates of the nFET 102 (N-metal) and pFET 104 (P-metal) devices, respectively, may be formed after removal of the dummy poly layer. Following the removal of the poly gate structures 116, a trench 171 in the nFET device 102 side and a trench 172 in the pFET device 104 side may be formed.

Figure 1D:
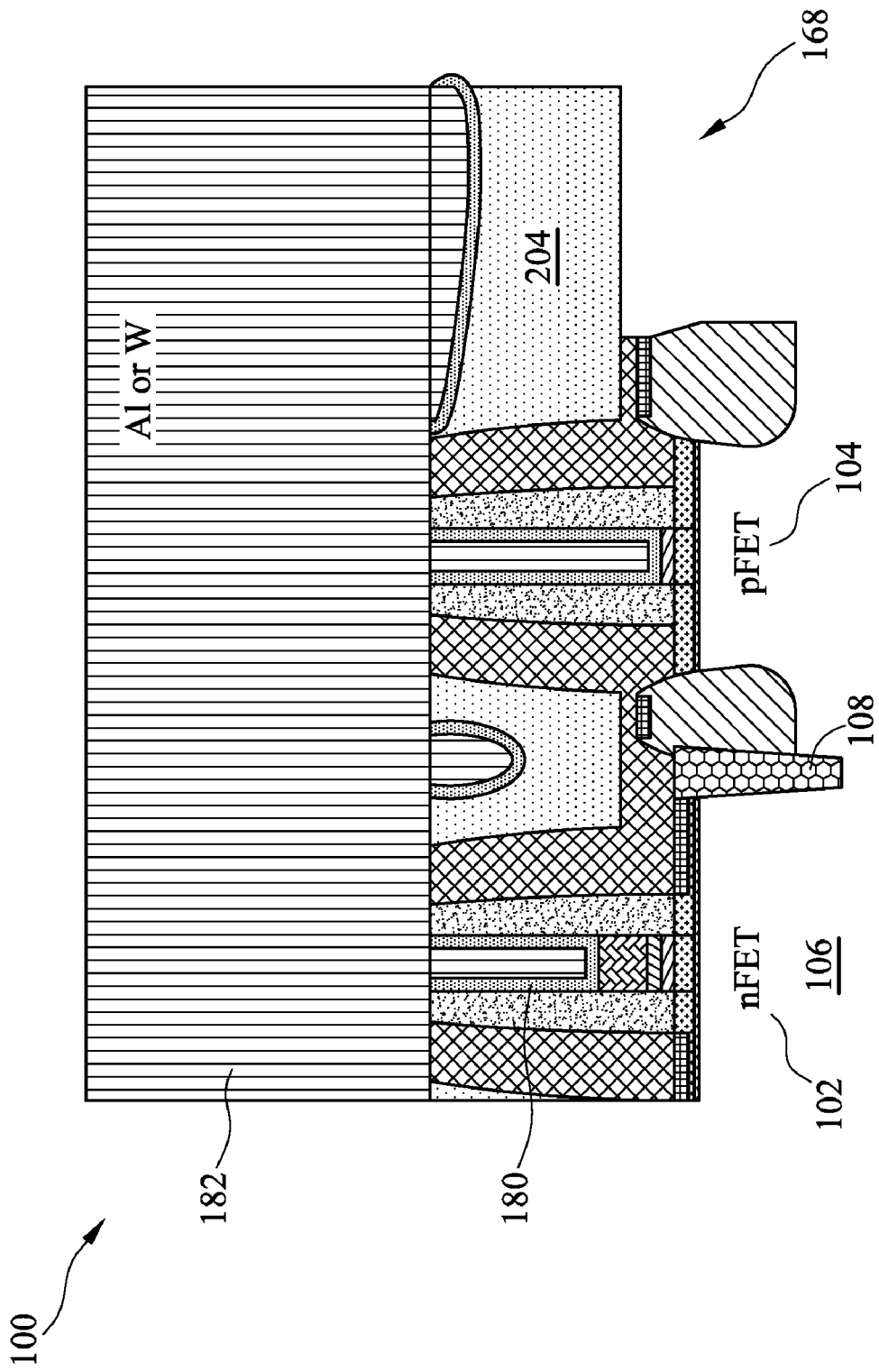
Figure 1E:
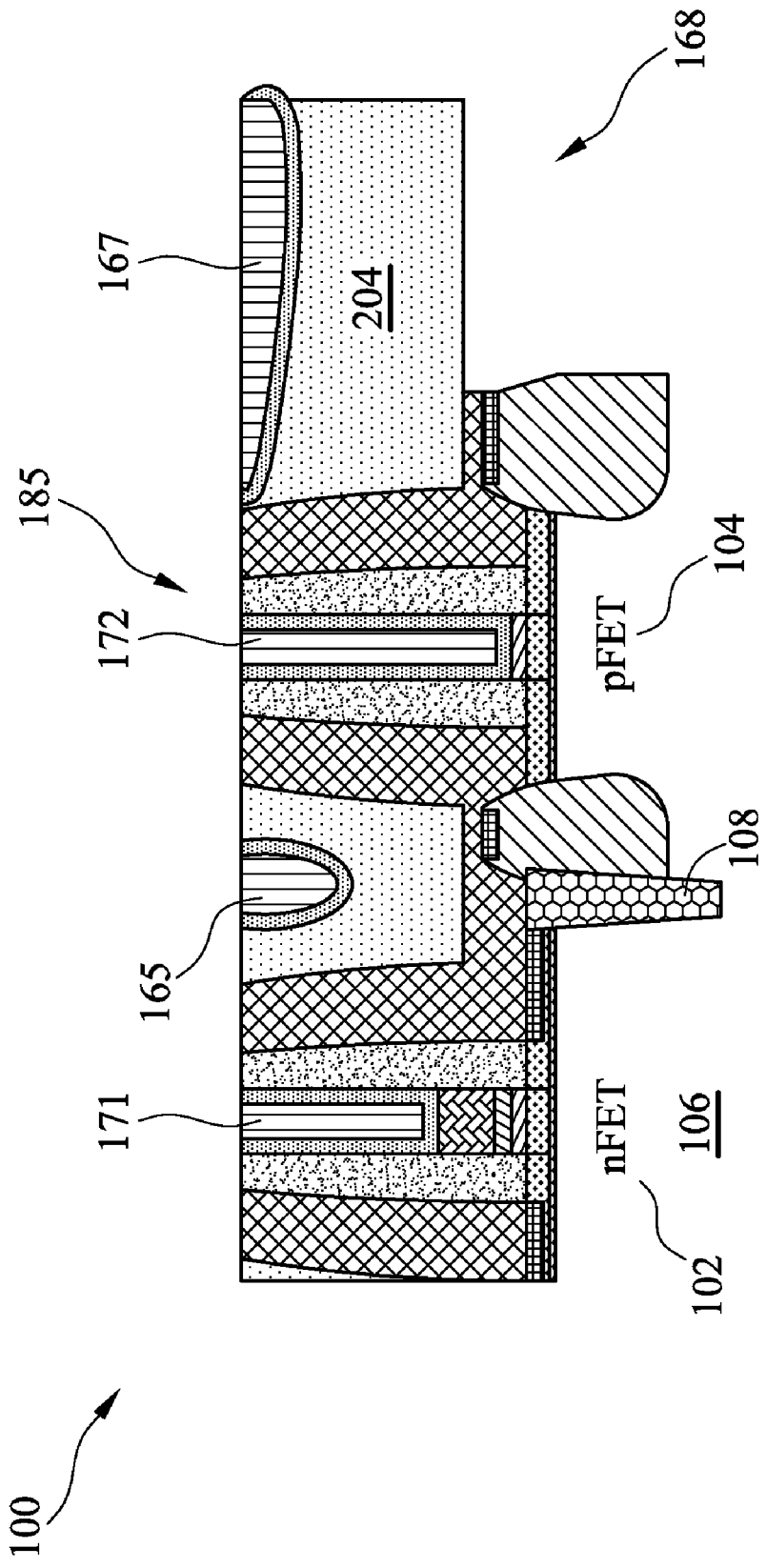

In FIG. 1D, a work function metal layer 180 such as WN or TiN may be deposited over the dielectric layer 150 filling in a portion of the trenches 171, 172. The work function metal layer 180 may be deposited by CVD or PVD. A filler metal layer 182 such as Al, W, or Cu may then be deposited over the work function metal layer 180 filling in the remaining portion of the trenches 171, 172. The filler metal layer 182 may be formed by CVD, PVD, plating, or other suitable process. It should be noted that the work function metal layer 180 and filler metal layer 182 may also be deposited in the void 165 between the devices 102, 104 and the eroded portion 167 in the isolated region 168. In FIG. 1E, a CMP (e.g., metal CMP process) process may be performed on the filler metal layer 180 and work function metal layer 182 and may stop at the interlayer dielectric. Following the CMP process, metal residues may remain in the void 165 and eroded portion 167, which can adversely effect subsequent processing.

Figure 1F:
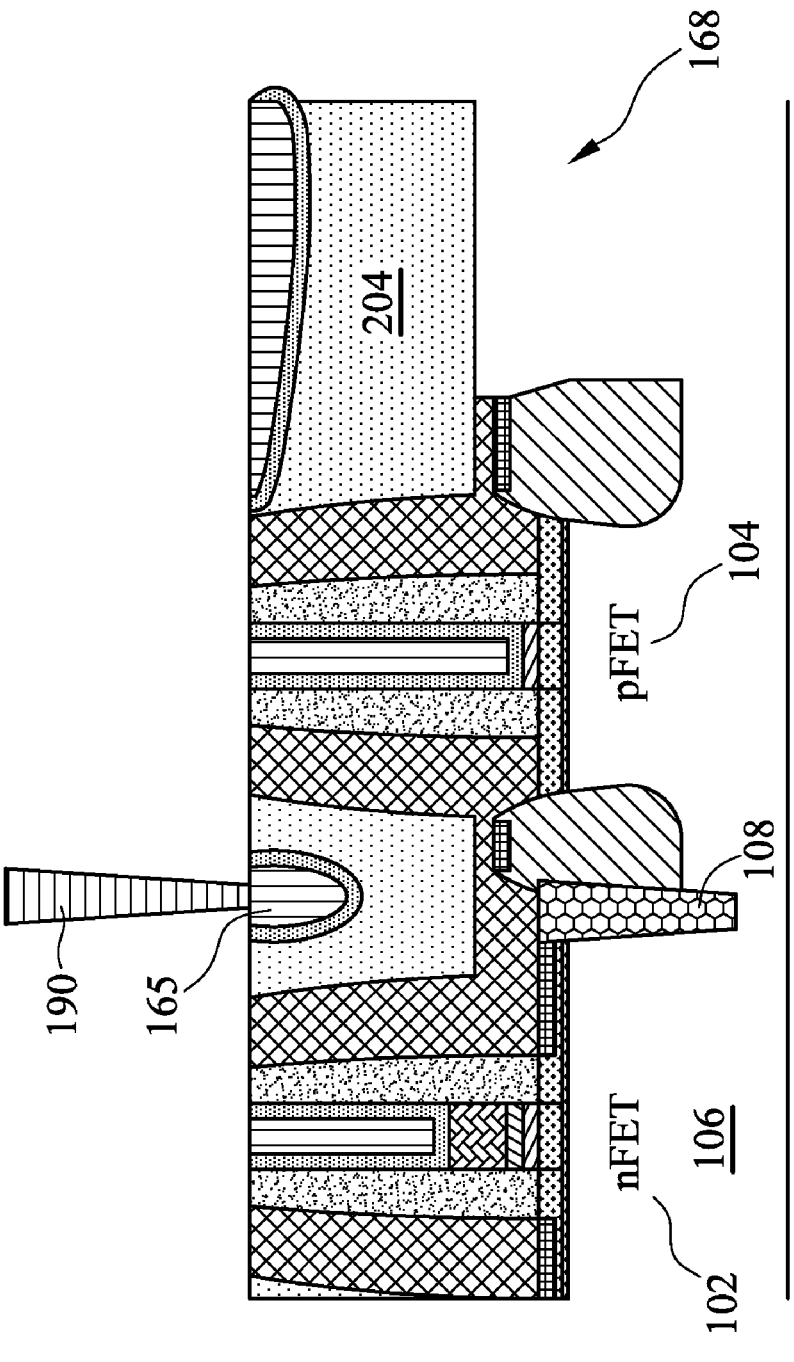

In FIG. 1F, a first contact 190 may be formed through the ILD layer 150 for connecting to the S/D regions of the nFET 102 and pFET 104 devices via the silicide features 122. However, during the formation of the first contact 190, the metal residue in the void 165 may stop an etching process from reaching or landing on the silicide region 122. Accordingly, the semiconductor device 100 may be defective in connecting to the doped regions (e.g., S/D regions) of the nFET 102 and pFET 104 devices. Further, the region 168 may include an overlay box that is used for alignment in a photolithography patterning process. The metal residue in the eroded portion 167 may adversely effect the mechanism that aligns the overlay box in region 168 with an alignment mark on the photomask or reticle in the photolithography patterning process.

Figure 2:
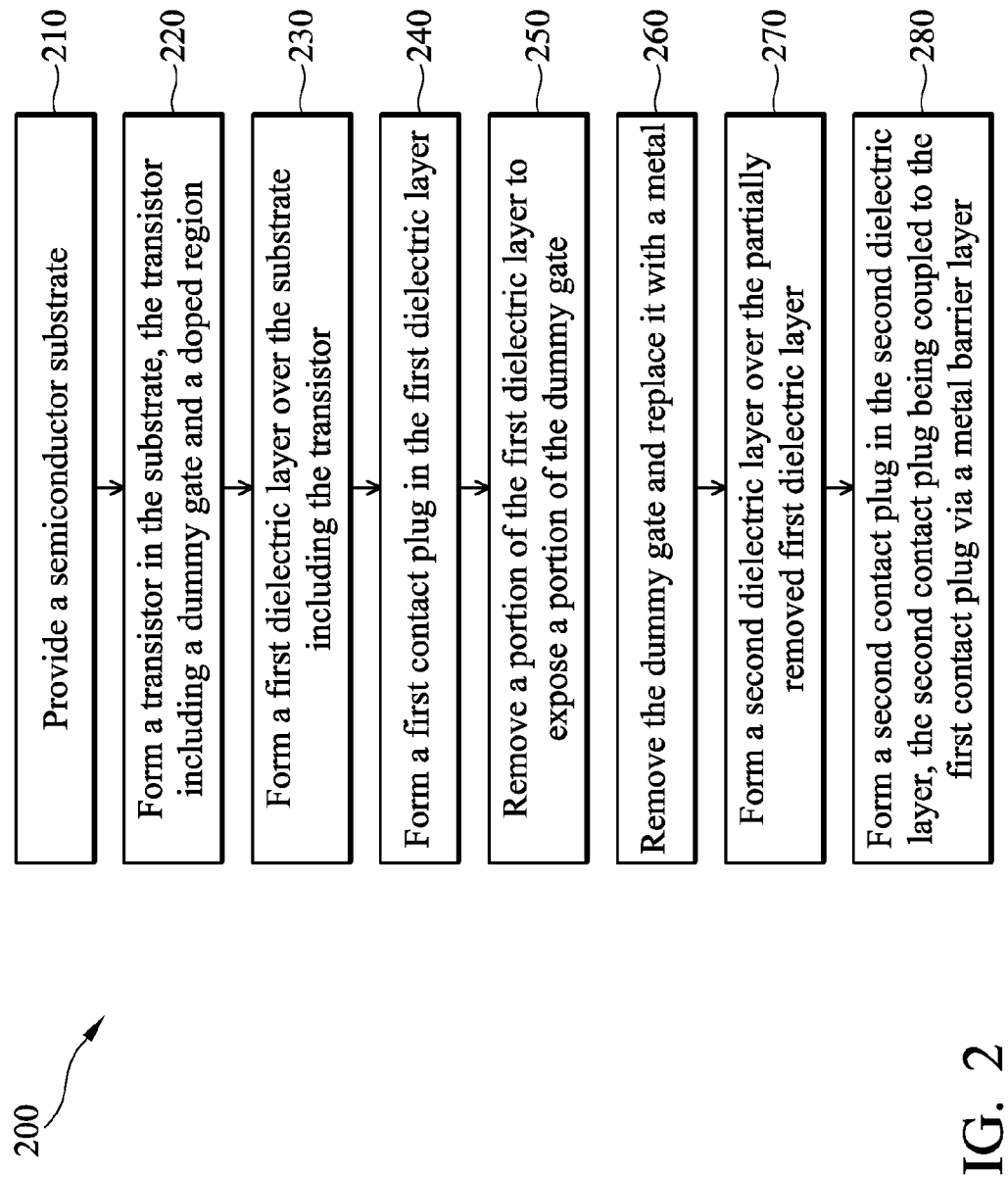
FIG. 2 is a flowchart of a method for fabricating a semiconductor device having a dual first contact structure according to various aspects of the present disclosure.

Referring to FIG. 2, illustrated is a flowchart of a method 200 for fabricating a semiconductor device having a dual first contact structure according to various aspects of the present disclosure. Referring also to FIGS. 3A to 3H, illustrated are cross-sectional views of a semiconductor device 300 being fabricated according to the method 200 of FIG. 2. The semiconductor device 300 may be similar to the semiconductor device 100 of FIG. 1 except for the differences discussed below. Accordingly, similar features in FIGS. 1 and 3 are numbered the same for the sake of simplicity and clarity.

It is understood that part of the semiconductor device 300 may be fabricated by complementary metal-oxide-semiconductor (CMOS) technology process flow, and thus some processes are only briefly described herein. Further, the semiconductor device 300 may include various other devices and features such as other types of transistors such as bipolar junction transistors, resistors, capacitors, diodes, fuses, etc. but is simplified for a better understanding of the inventive concepts of the present disclosure.

Figure 3A:
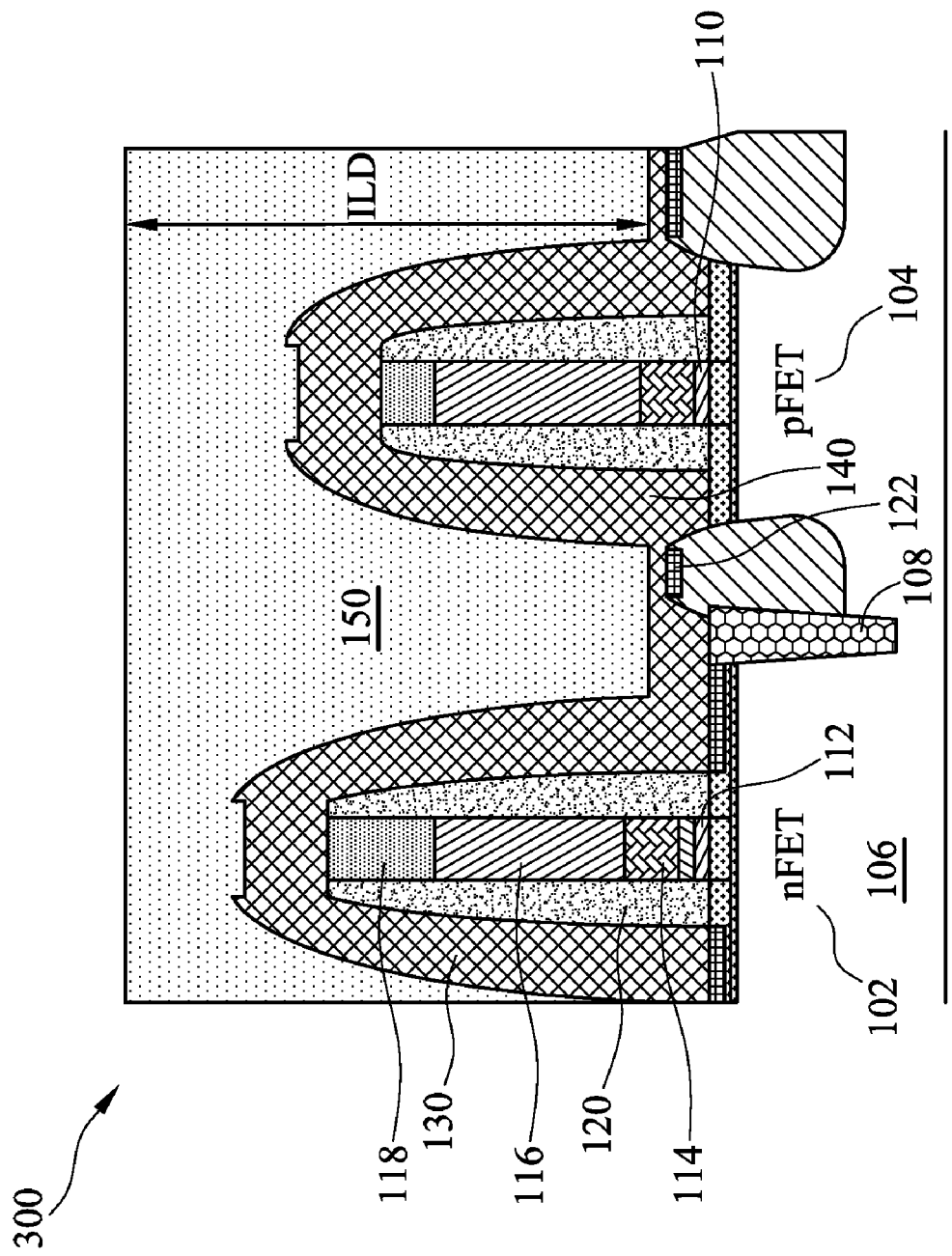
FIGS. 3A to 3H are cross-sectional views of a semiconductor device at various stages of fabrication according to the method of FIG. 2.

The method 200 begins with block 210 in which a semiconductor substrate may be provided. In FIG. 3A, the semiconductor device 300 may include a semiconductor substrate 106 such as a silicon substrate. The substrate 106 may include various doping configurations depending on design requirements as is known in the art. The semiconductor device 100 may further include an isolation structure 108 such as a shallow trench isolation (STI) feature formed in the substrate 106 for isolating the active regions in the substrate as is known in the art.

The method 200 continues with block 220 in which a transistor may be formed in the substrate, the transistor having a dummy gate and a doped region. The semiconductor device 300 may include regions 102 and 104 in which an N-channel field effect transistor (nFET) and P-channel FET (pFET) may be formed, respectively. The nFET 102 and pFET 104 devices may each include a gate dielectric layer 110 including an interfacial layer/high-k dielectric layer formed over the substrate 106. The high-k dielectric layer may be formed on the interfacial layer by atomic layer deposition (ALD) or other suitable technique. The high-k dielectric layer may include hafnium oxide ($HfO_2$). Alternatively, the high-k dielectric layer may optionally include other high-k dielectrics, such as $TiO_2$, $HfZrO$, $Ta_2O_3$, $HfSiO_4$, $ZrO_2$, $ZrSiO_2$, combinations thereof, or other suitable material. Further, the high-k gate dielectric layer may include a multiple layer configuration such as $HfO_2/SiO_2$ or $HfO_2/SiON$.

The nFET 102 and pFET 104 devices may each further include a capping layer 112 for tuning a work function of a metal layer (for the gate electrode) for properly performing as an nFET and pFET, respectively. For example, the capping layer 112 may include $Al_2O_3$, $La_2O_3$, LaSiO, TiAlN, TaN, TaC, TiN, TaSi, TiAl, combinations thereof, or other suitable material. The capping layer may be formed on or underneath the high-k dielectric layer. The capping layer may be formed by ALD, CVD, or PVD.

The nFET 102 and pFET 104 device may each further include a metal gate layer 114 formed over the gate dielectric layer 110. The metal gate layer 114 may include an N work function metal (N-metal) or P work function metal (P-metal) depending on the type of transistor. The metal gate layer 114 may include TiN, TaN, $ZrSi_2$, $MoSi_2$, $TaSi_2$, $NiSi_2$, WN, or other suitable material. The devices 102, 104 may each further include a dummy polysilicon or poly layer 116 formed on the metal gate layer 114 by a deposition or other suitable process. The devices 102, 104 may each further include a hard mask 118 formed over the dummy poly layer 116. Sidewall spacers 120 may be formed on either side of the gate stack as is known in the art. The sidewall spacers may include silicon nitride, silicon oxide, or silicon oxynitride.

The nFET 102 and pFET 104 devices may each further include source/drain regions including lightly doped source/drain regions and heavy doped source/drain regions. The source/drain regions may be formed by implanting p-type or n-type dopants or impurities into the substrate 106 depending on the configuration of the transistors 102, 104. The transistors 102, 104 may further include silicide features 122 formed on the source/drain regions by a salicide (self-aligned silicide) process to form a contact.

After formation of the various microelectronic devices and structures discussed above, a stressed layer may be formed over the substrate 106. For example, a tensile-contact etch stop layer (T-CESL) 130 may be formed over the nFET device 102, and a compressive-CESL (C-CESL) 140 may be formed over the pFET device 104. The T-CESL 130 and C-CESL 140 may be formed of silicon nitride, silicon oxynitride, and/or other suitable materials.

The method 200 continues with block 230 in which a first dielectric layer may be formed over the substrate including the transistor. A dielectric layer such as an inter-layer (or level) dielectric (ILD) layer 150 may be formed overlying the T-CESL 130 and C-CESL 140 by chemical vapor deposition (CVD), high density plasma CVD (HDP), spin-on glass (SOG), physical vapor deposition (PVD or sputtering), or other suitable methods. The ILD layer 150 may include silicon oxide, silicon oxynitride, or a low-k material.

Figure 3B:
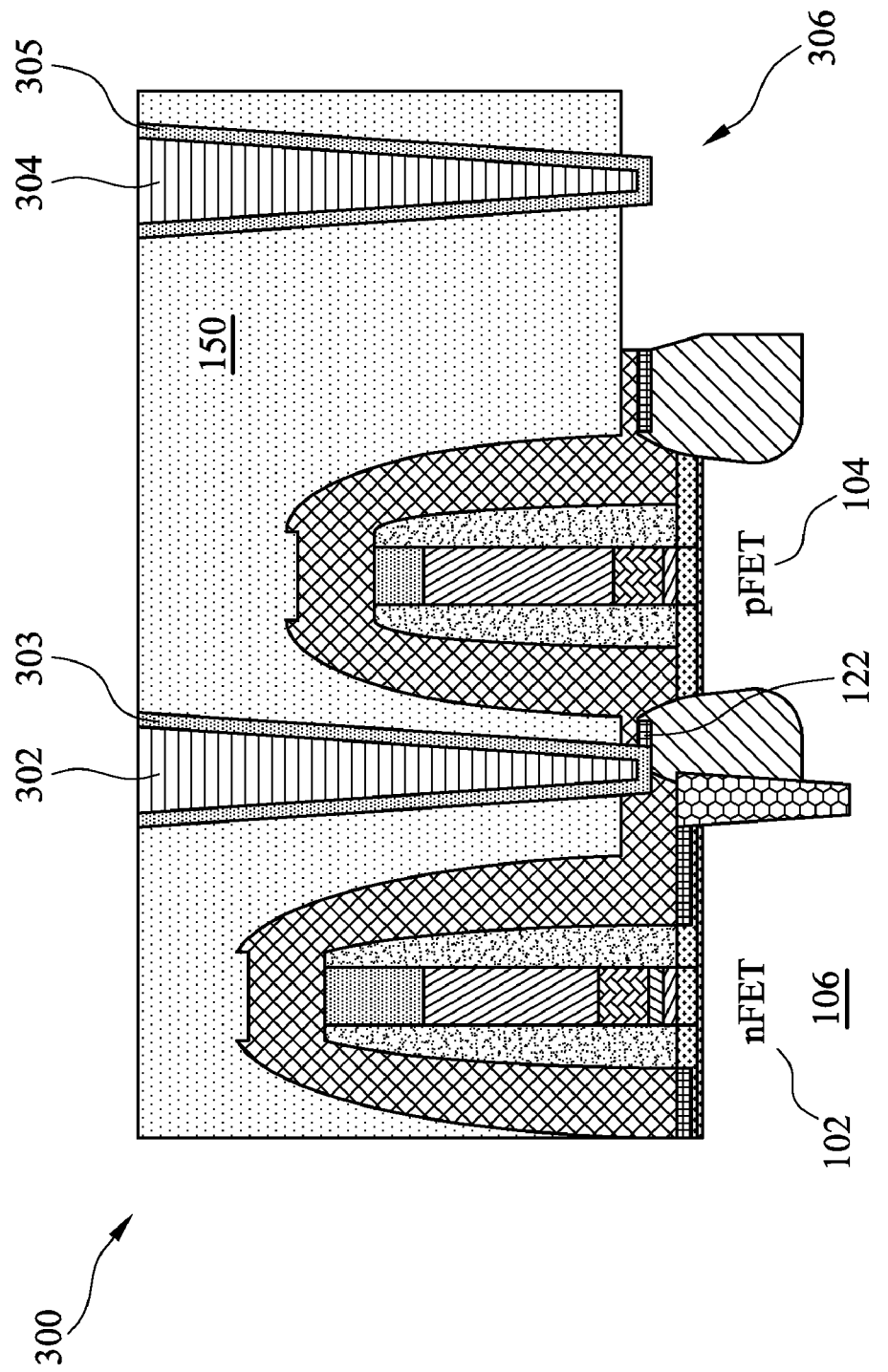

The method 200 continues with block 240 in which a first contact plug may be formed in the first dielectric layer. In FIG. 3B, a contact plug 302 including a metal barrier layer 303 may be formed in the ILD layer 150. The metal barrier layer 303 may be formed on the sidewalls and bottom of the contact plug 302. The contact plug 302 may be coupled to the S/D region of the pFET device 104 via the silicide feature 122. Another contact plug 304 including a metal barrier layer 305 may be formed in the ILD layer 150 in a region 306 (similar to region 168 of FIG. 1) where there are none or a few devices formed therein. That is, a pattern density in the region 306 is substantially less than the patterning density in the region of the devices 102, 104. For example, the region 306 may include an overlay box used for alignment in a photolithography patterning process as was discussed above in FIG. 1. Accordingly, the contact plug 304 may be considered a dummy contact plug since it is not being used as a contact/connecting structure. It should be noted that the dummy contact plug may reduce the risk of erosion during a subsequent ILD CMP process since the pattern density in region 306 has been increased. Also, it is understood that the number of dummy contact plugs may vary and may depend on the desired pattern density to be achieved in the region 306.

The contact plugs 302, 304 and metal barrier layers 303, 305 may be formed by first patterning and etching the ILD layer 150 to form trenches. The trenches may be filled by depositing a metal barrier layer, such as TiN, and then depositing a contact plug layer, such as W, on the metal barrier layer. A CMP process may be performed on the contact plug layer and metal barrier layer, and may stop at the ILD layer 150.

Figure 3C:
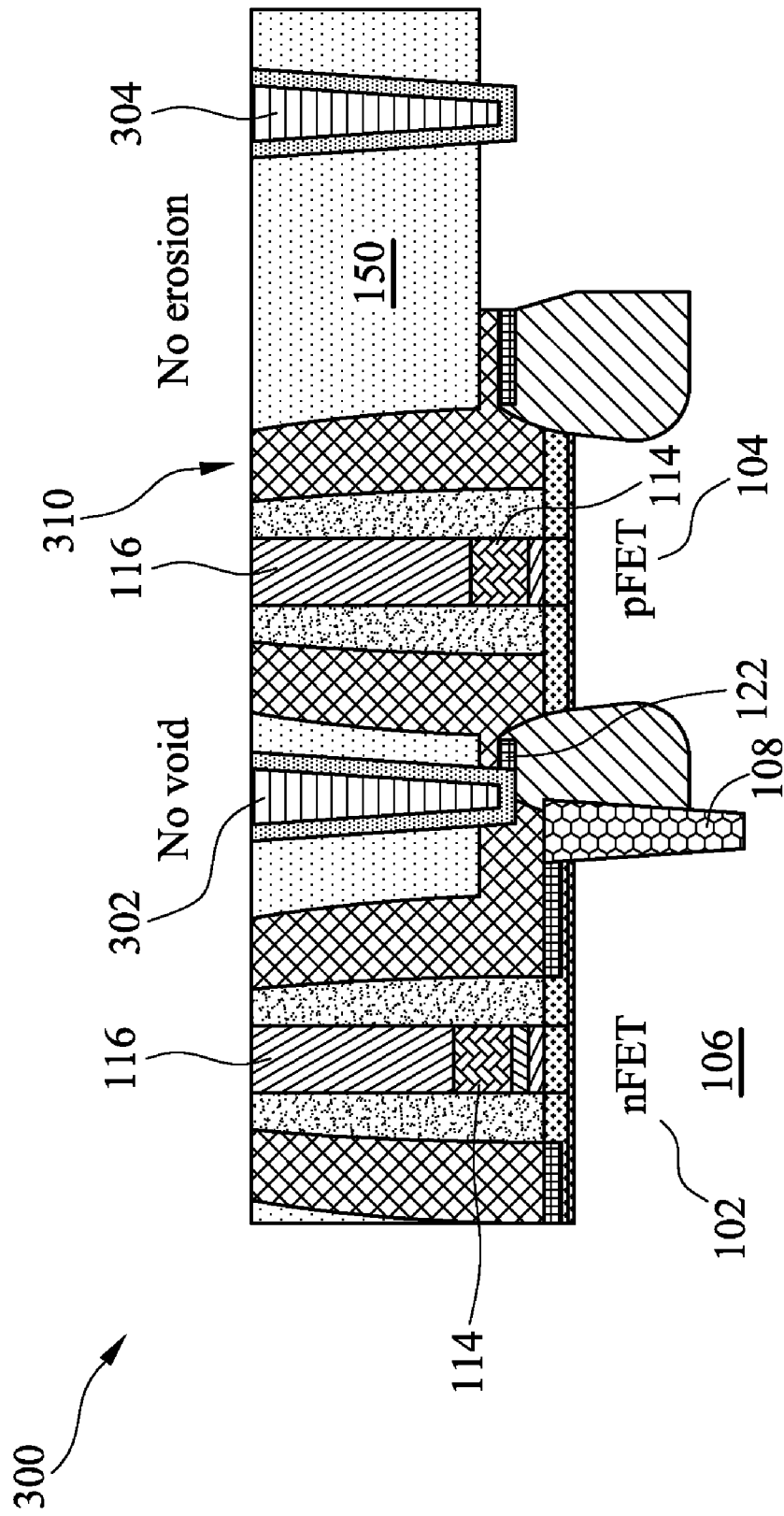

In a gate last process, the dummy poly gate structures 116 of the devices 102, 104 may be removed and replaced with metal gate structures as discussed below. The method 200 continues with block 250 in which a portion of the first dielectric layer may be removed to expose a portion of the dummy gate. In FIG. 3C, a CMP process (e.g., an ILD CMP process) 310 may be performed on the ILD layer 150 to expose a top portion of the dummy poly layer 116 in the nFET 102 and pFET 104 devices. The CMP process 310 may first planarize the ILD layer 150 to reach the hard mask 118, and then continue to remove the hard mask 118 until the top portion of the dummy poly layer 116 is reached. It should be noted that the contact plug 302 between the devices 102, 104 may help prevent formation of a void between the devices 102, 104, and that the contact plug 304 may help prevent erosion of region 306. Accordingly, a substantially planar surface may result following the CMP process 310.

Figure 3D:
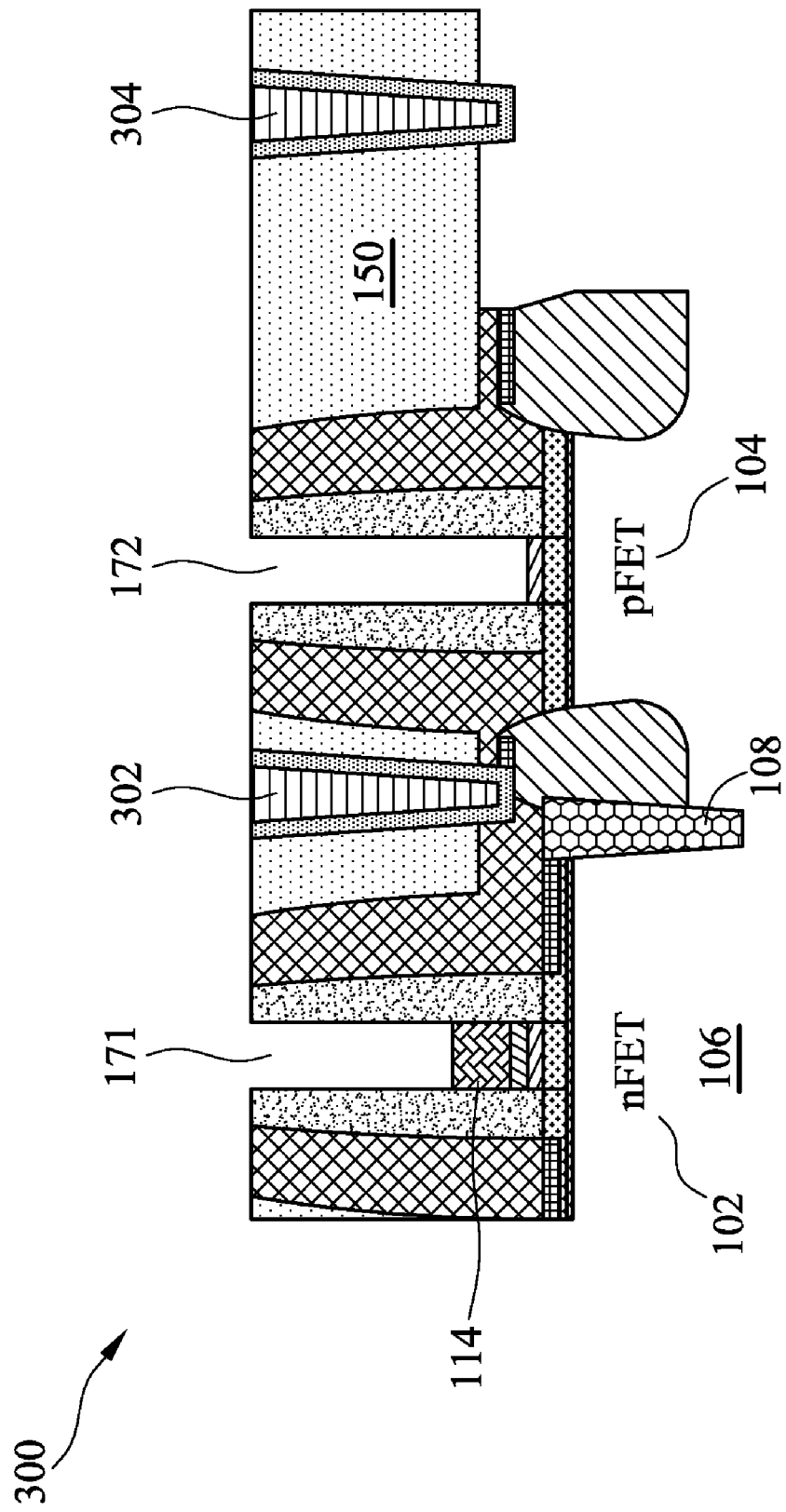

The method 200 continues with block 260 in which the dummy gate may be removed and replaced with a metal. In FIG. 3D, the dummy poly layer 116 may be removed in both the nFET 102 and pFET 104 device by an etch back process (wet etching) or other suitable process. Further, the metal gate layer 114 in the pFET device 104 may be removed by an etch process so that a P-metal may be re-deposited. It should be noted that the metal gate layer 114 in the nFET device 102 may remain and perform as an N-metal. Accordingly, the process may be considered as a hybrid process including a gate first process for the nFET device and a gate last process for the pFET device. In other embodiments, both the metal gates of the nFET 102 (N-metal) and pFET 104 (P-metal) devices are deposited after removal of the dummy poly layer. Following the removal of the poly gate structures 116, a trench 171 in the nFET device 102 and a trench 172 in the pFET device 104 may be formed.

Figure 3E:
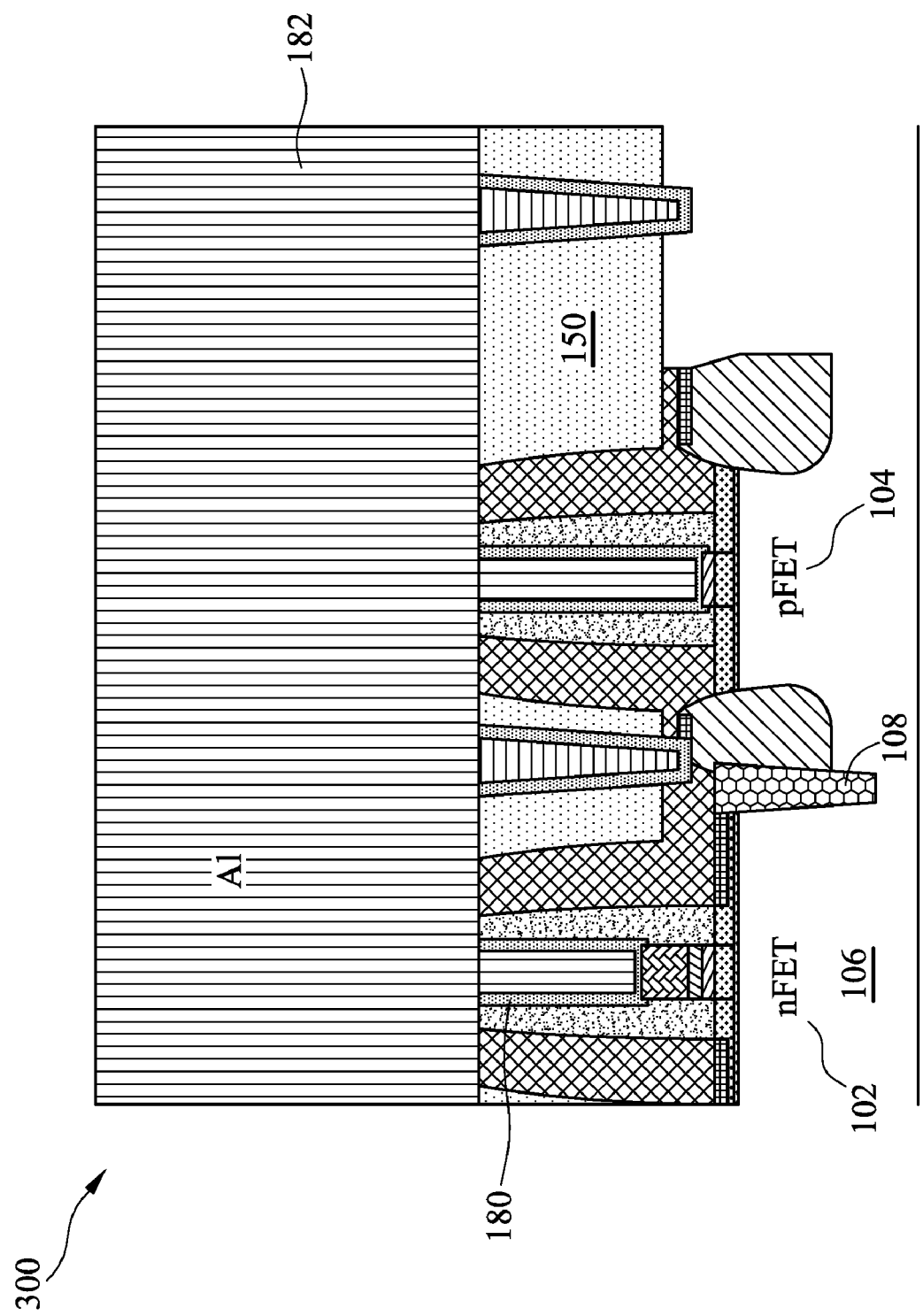
Figure 3F:
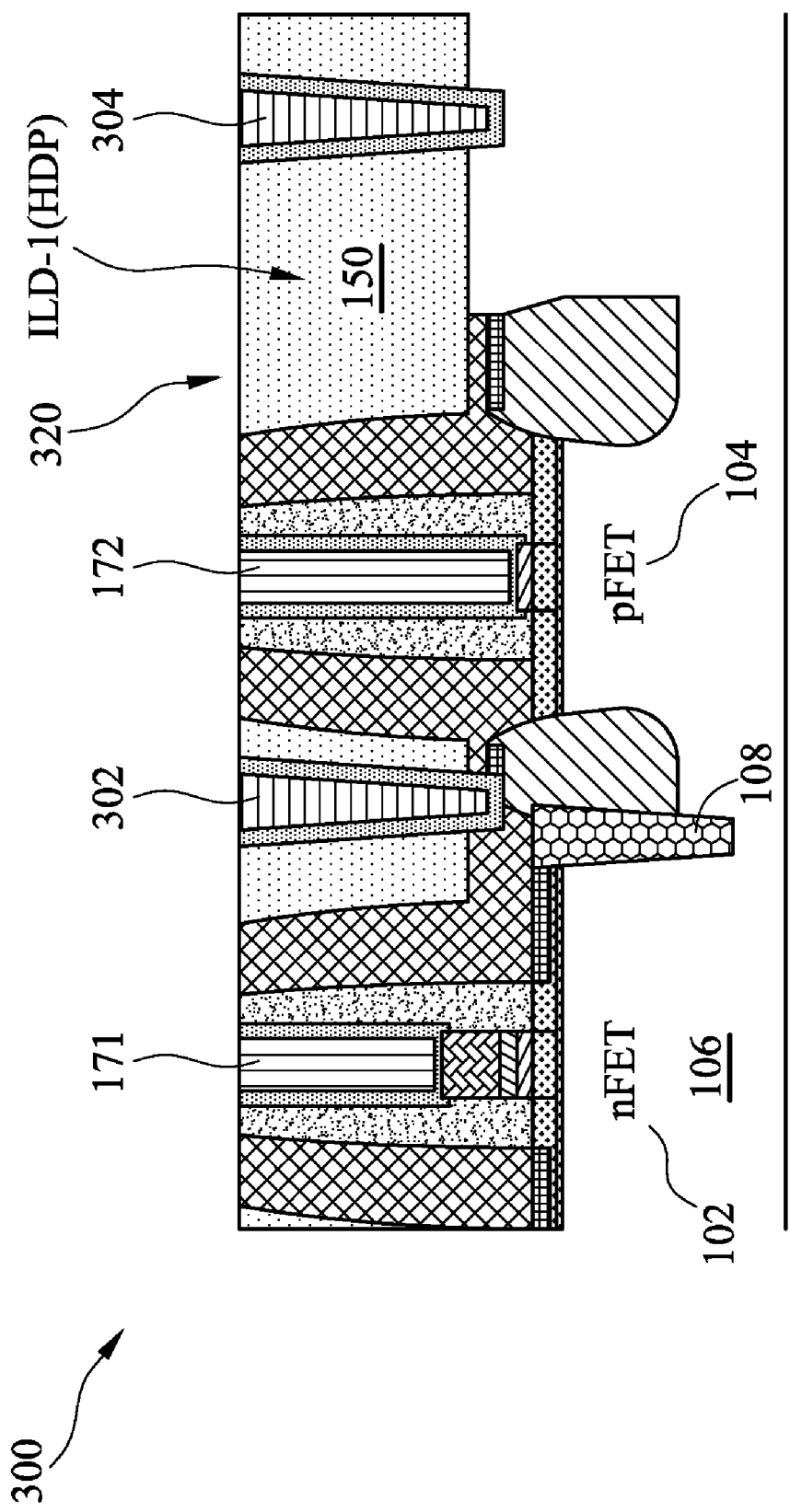

In FIG. 3E, a work function metal layer 180 such as WN or TiN may be deposited over the dielectric layer 150 filling in a portion of the trenches 171, 172. The work function metal layer 180 may be deposited by CVD or PVD. A filler metal layer 182 such as Al, W, or Cu may then be deposited over the work function metal layer 180 filling in the remaining portion of the trenches 171, 172. The filler metal layer 182 may be formed by CVD, PVD, plating, or other suitable process. In FIG. 3F, a CMP (e.g., metal CMP process) process 320 may be performed on the filler metal layer 180 and may stop at the interlayer dielectric 150.

Figure 3G:
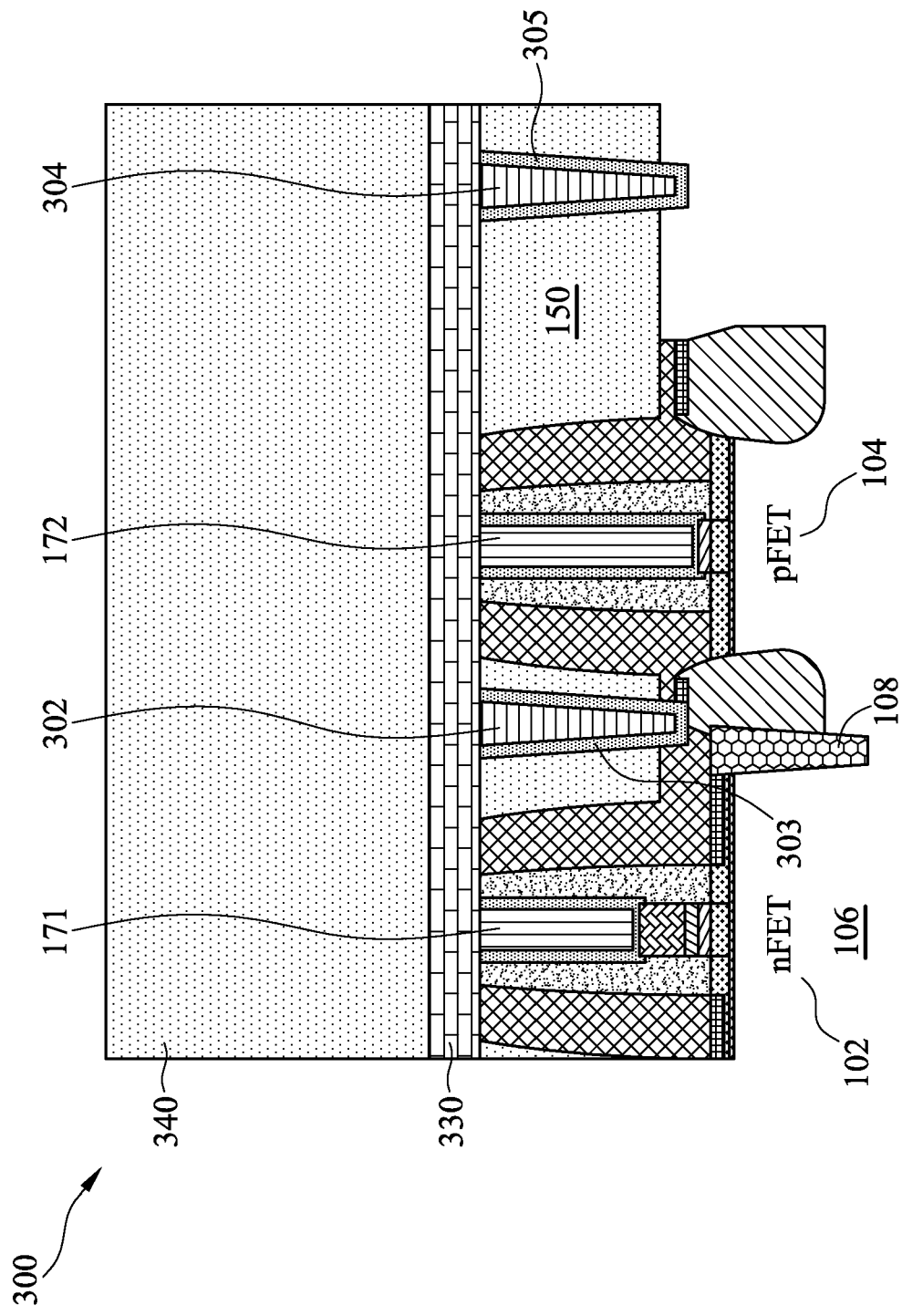

The method 200 continues with block 270 in which a second dielectric layer may be formed over the first dielectric layer. In FIG. 3G, a dielectric barrier layer 330 may be formed on the planarized surface by CVD or other suitable process. The dielectric barrier layer 330 may include SiON, SiC, combinations thereof, or other suitable material. An interlayer dielectric (ILD) layer 340 may be formed on the barrier layer 330 by HDP, sub-atmospheric CVD (SACVD), spin-on glass (SOG), or other suitable process. The ILD layer 340 may include silicon oxide, silicon oxynitride, or a low-k material.

Figure 3H:
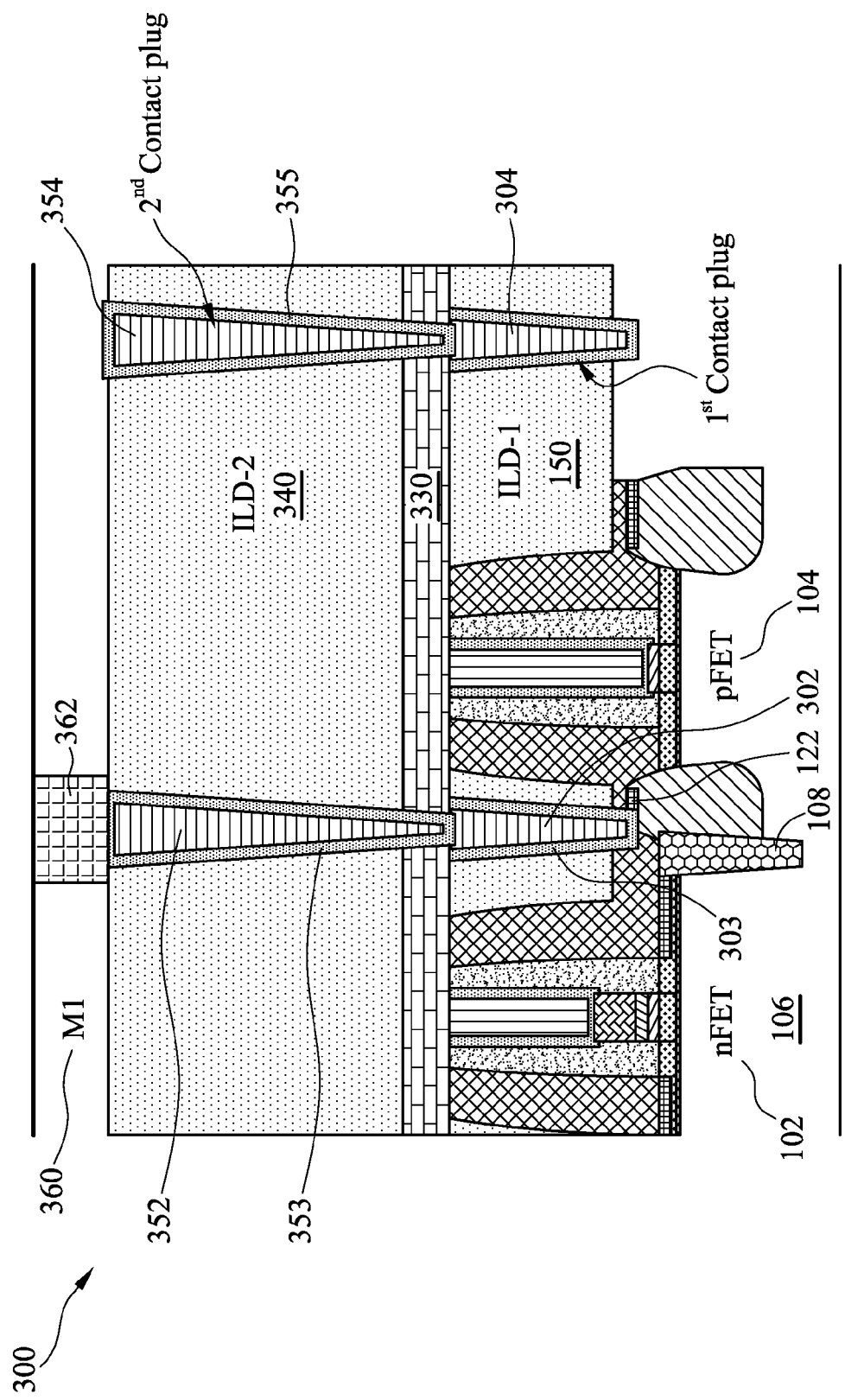

The method 200 continues with block 280 in which a second contact plug may be formed in the second dielectric layer, the second contact plug being coupled to the first contact plug. In FIG. 3H, a contact plug 352 including a metal barrier layer 353 may be formed in the ILD layer 340 and barrier layer 330. The metal barrier layer 353 may be formed on the sidewalls and bottom of the contact plug 352. The contact plug 352 may be coupled to the contact plug 302 via the metal barrier layer 353. Another contact plug 354 including a metal barrier layer 355 may be formed in the ILD layer 340 and barrier layer 330 in the region 306. The contact plug 354 may be coupled to the contact plug 304 via the metal barrier layer 355. In some embodiments, the contact plug 354 may be omitted since the contact plug 304 is used as a dummy contact plug.

The contact plugs 352, 354 and metal barrier layers 353, 355 may be formed by first patterning and etching the ILD layer 340 to form trenches (e.g., using a similar photomask as in FIG. 3B). The trenches may be filled by depositing a metal barrier layer, such as TiN, and then depositing a contact plug layer, such as W, on the metal barrier layer. In some embodiments, the metal barrier layer may include Ti/TiN for a W contact plug. In some other embodiments, the metal barrier layer may include Ta/TaN for a Cu contact plug. A CMP process may be performed on the contact plug layer and metal barrier layer, and may stop at the ILD layer 340.

Thereafter, the semiconductor device 300 may undergo further processing such as forming an interconnect structure that includes a metal layer 360 (e.g., first metal layer (M1)) for connecting to the dual first contact structure including contact plugs 302, 352 and metal barrier layers 303, 353. The metal layer 360 may include a metal structure that is electrically coupled to the contact plug 353. It should be noted that the contact plugs 354 and 304 may not be connected to the first metal layer 360 since the contact plugs 354 and 304 may be used as dummy contact plug to improve the ILD CMP process as discussed in FIG. 3C. However, in other embodiments, the contact plugs 354 and 304 may be used as real contact/connect structures, and thus may be connected to the interconnect structure.

Figure 4:
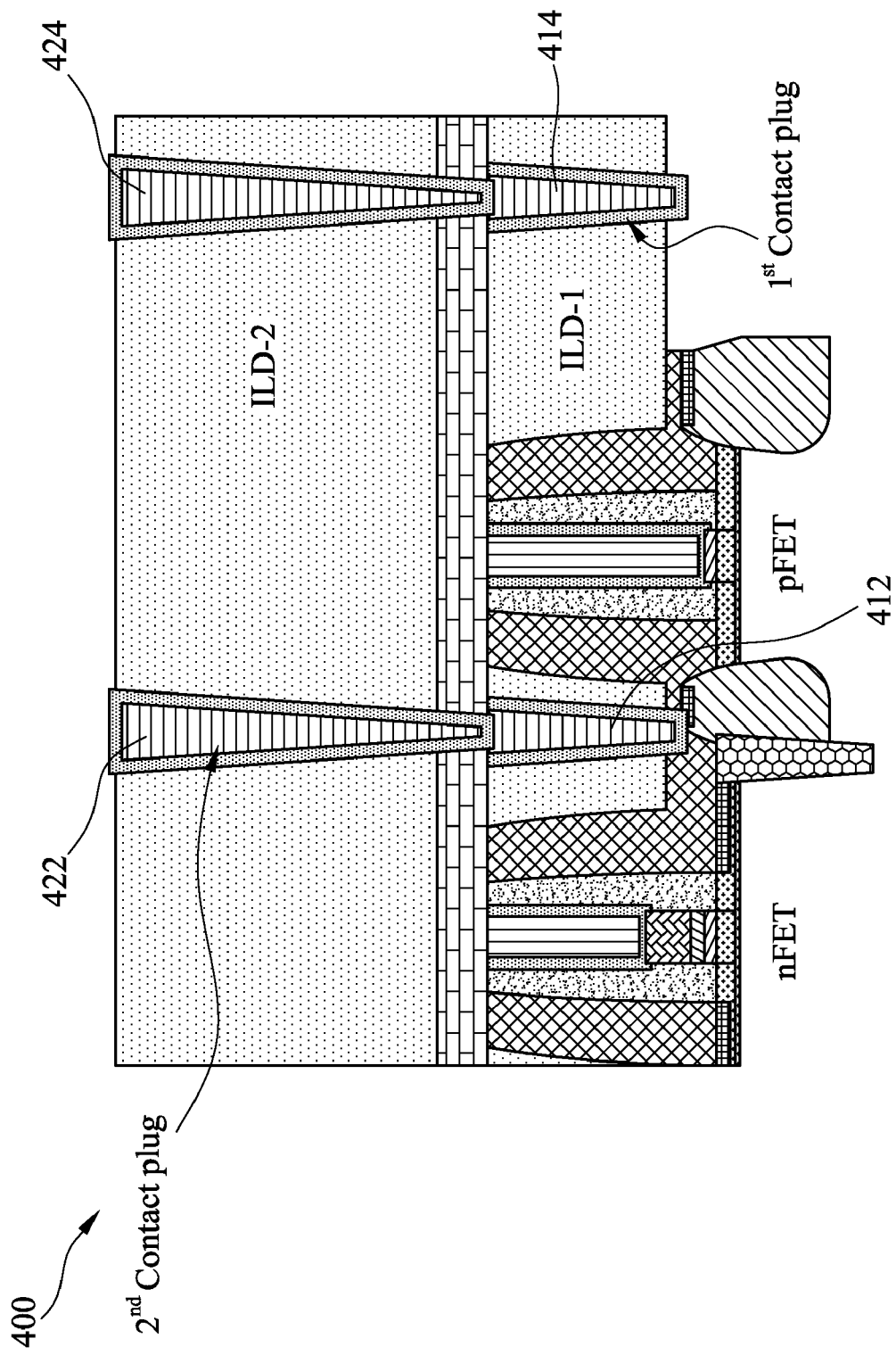
FIG. 4 is a cross-sectional view of a semiconductor device having a dual first contact structure according to various aspects of the present disclosure.

Referring to FIG. 4, illustrated is a semiconductor device 400 having an alternative dual first contact structure according to various embodiments of the present disclosure. The semiconductor device 400 may be similar to the semiconductor device 300 of FIG. 3H except for a size of the dual first contact structure. The semiconductor device 400 may include a dual first contact structure having first contact plugs 412, 414 that have a substantially larger width (cross-section) than second contact plugs 422, 424.

Figure 5:
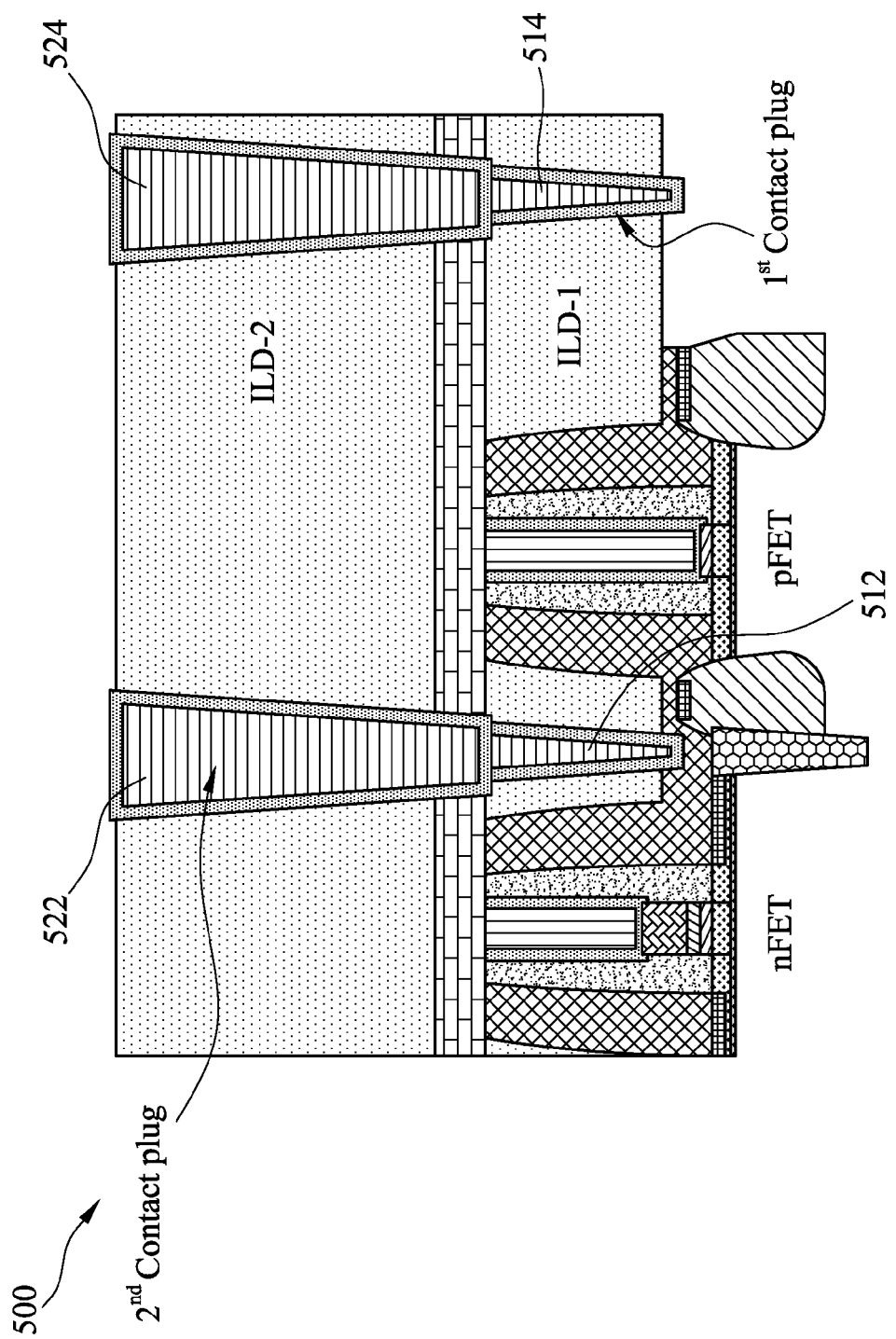
FIG. 5 is a cross-sectional view of a semiconductor device having an alternative dual first contact structure according to various aspects of the present disclosure.

Referring to FIG. 5, illustrated is a semiconductor device 500 having an alternative dual first contact structure according to various embodiments of the present disclosure. The semiconductor device 500 may be similar to the semiconductor device 300 of FIG. 3H except for a size of the dual first contact structure. The semiconductor device 500 may include a dual first contact structure having first contact plugs 512, 514 that have a substantially smaller width (cross-section) than second contact plugs 522, 524.

Figure 6:
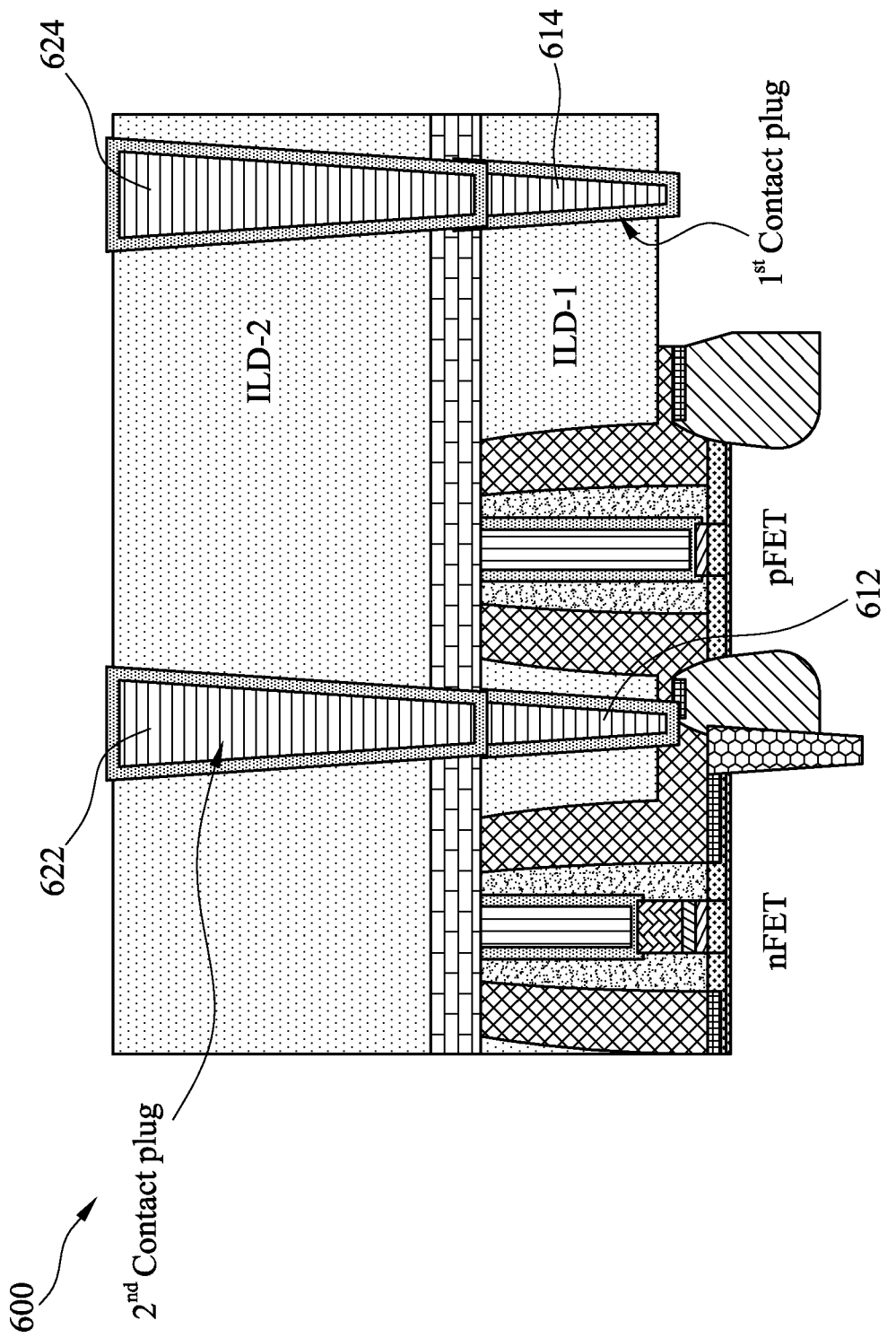
FIG. 6 is a cross-sectional view of a semiconductor device having another alternative dual first contact structure according to various aspects of the present disclosure.

Referring to FIG. 6, illustrated is a semiconductor device 600 having an alternative dual first contact structure according to various embodiments of the present disclosure. The semiconductor device 600 may be similar to the semiconductor device 300 of FIG. 3H except for a size of the dual first contact structure. The semiconductor device 600 may include a dual first contact structure having first contact plugs 612, 614 that have substantially a same width (cross-section) as second contact plugs 622, 624.

Thus, provided is a semiconductor device that includes a semiconductor substrate, a transistor formed on the substrate, the transistor having a gate stack including a metal gate and high-k gate dielectric, and a dual first contact formed on the substrate, the dual first contact including a first contact feature, a second contact feature overlying the first contact feature, and a metal barrier layer formed on sidewalls and bottom of the second contact feature, the metal barrier layer coupling the first contact feature to the second contact feature. In some embodiments, the first contact feature and the second contact feature are each one of copper (Cu) and tungsten (W). In other embodiments, the first contact feature has substantially a same width as the second contact feature. In some other embodiments, the first contact feature has substantially a different width as the second contact feature. In other embodiments, the high-k gate dielectric includes one of $HfO_2$, HfZrO, and $HfSiO_4$. In still other embodiments, the high-k gate dielectric is a multi-layer structure including one of $HfO_2/SiO_2$ and $HfO_2/SiON$.

In some other embodiments, the transistor further includes a capping layer formed on the high-k gate dielectric, the capping layer including one of $Al_2O_3$, $La_2O_3$, and LaSiO. In yet other embodiments, the transistor further includes a capping layer formed on the high-k gate dielectric, the capping layer having a multi-layer structure including one of $La_2O_3$/Si and $La_2O_3$/$Al_2O_3$. In some embodiments, the metal gate includes one of Al, W, Cu, WN, TiN, and combinations thereof. In other embodiments, the transistor includes a doped region, wherein a first contact feature is coupled to the doped region via a silicide feature.

Also provided is a method for fabricating a semiconductor device that includes providing a semiconductor substrate, forming a transistor having a dummy gate structure, forming a first dielectric layer over the substrate including the transistor, forming a first contact feature in the first dielectric layer, removing a portion of the first dielectric layer to expose a portion of the dummy gate structure, removing the dummy gate structure and replacing it with a metal gate, forming a second dielectric layer over the first dielectric layer, and forming a second contact feature and a metal barrier in the second dielectric layer, the second contact feature being coupled to the first contact feature via the metal barrier. In some embodiments, the step of removing the portion of the first dielectric layer includes performing a chemical mechanical polishing (CMP) on the first dielectric layer. In other embodiments, the step of removing the dummy gate structure and replacing it with a metal gate includes performing an etch back process to remove the dummy gate structure thereby forming a trench, filling a portion of the trench with a work function metal layer, filling the remaining portion of the trench with a filler metal layer, and performing a CMP process on the filler metal layer and work function metal layer to form the metal gate. In some other embodiments, the method further includes forming a metal layer over the second dielectric layer, the metal layer being electrically coupled to the second contact feature.

Further, a semiconductor device is provided that includes a semiconductor substrate having a first region and a second region, at least two transistors formed in the first region, the at least two transistors each having a metal gate and high-k gate dielectric, and a dual contact structure formed in the first region between the at least two transistors. The dual contact structure includes a first contact plug, the first contact plug having a surface that is co-planar with a surface of the metal gate and a second contact plug coupled to the surface of the first contact plug. In some embodiments, the semiconductor device further includes a first metal layer of an interconnect structure, wherein the second contact plug is coupled to the first metal layer. In other embodiments, the second region includes a pattern density that is substantially less than a pattern density of the first region and the semiconductor device further includes a dummy contact plug disposed in the second region, the dummy contact plug being co-planar with the first contact plug. In some other embodiments, the first contact plug, second contact plug, and dummy contact plug are each one of copper (Cu) and tungsten (W). In still other embodiments, the dual contact structure further includes a metal barrier layer formed on the sidewalls and bottom of the second contact plug, the metal barrier layer coupling the first contact plug to the second contact plug. In yet other embodiments, the dual contact structure includes a barrier metal layer formed on the sidewalls and bottom of the second contact plug, the barrier metal layer directly contacting the surface of the first contact plug.

The present invention achieves different advantages in various embodiments disclosed herein. For example, the present disclosed method provides a simple and cost-effective method and device for integrating a dual first contact structure in a gate last process or hybrid process. Also, the methods and devices disclosed herein may be easily integrated with current CMP process flow and thus are applicable in future and advanced technologies. Further, the methods and devices disclosed herein may help reduce the risk of erosion in regions of the substrate that have substantially less pattern densities as compared to other regions of the substrate, or dishing in other regions. Thus, a substantially planar surface may be achieved which improves the fabrication process.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method comprising:
   providing a semiconductor substrate;
   forming a transistor that includes a gate structure disposed over the semiconductor substrate, a source feature, and a drain feature, wherein the gate structure interposes the source feature and the drain feature and the gate structure includes a dummy gate;
   forming a first dielectric layer over the semiconductor substrate and the transistor;
   forming a first contact feature having a first width in the first dielectric layer, wherein the first contact feature is coupled to one of the source feature and the drain feature;
   removing a portion of the first dielectric layer such that the dummy gate of the gate structure is exposed and a portion of the first dielectric layer remains;
   replacing the dummy gate of the gate structure with a metal gate;
   after replacing the dummy gate, forming a second dielectric layer over the remaining portion of the first dielectric layer; and
   forming a second contact feature having a second width in the second dielectric layer, the second width being substantially the same as the first width, wherein the second contact feature is coupled to the first contact feature.

2. The method of claim 1 wherein the removing the portion of the first dielectric layer includes performing a chemical mechanical polishing on the first dielectric layer.

3. The method of claim 1 wherein the forming the second contact feature includes forming a contact plug having a metal barrier layer on sidewalls and a bottom of the contact plug, wherein the metal barrier layer effects coupling between the first contact feature and the second contact feature.

4. The method of claim 1 further including forming a metal interconnect layer over the second contact feature, wherein the metal interconnect layer is coupled to the second contact feature.

5. The method of claim 1 wherein the replacing the dummy gate of the gate structure with the metal gate includes:

performing an etch back process to remove the dummy gate from the gate structure, thereby forming a trench; and forming a work function metal layer and a filler metal layer in the trench, thereby forming the metal gate.

6. The method of claim 1 further including forming a first dummy contact feature in the first dielectric layer when forming the first contact feature, wherein the first dummy contact feature is coupled to the semiconductor substrate.

7. The method of claim 6 further including forming a second dummy contact feature in the second dielectric layer when forming the second contact feature, wherein the second dummy contact feature is coupled to the first dummy contact feature.

8. The method of claim 7 wherein the first dummy contact feature and the second dummy contact feature have a substantially same width.

9. The method of claim 7 wherein a pattern density of a region of the semiconductor substrate where the first contact feature and the second contact feature is formed is substantially less than a pattern density of another region of the semiconductor substrate where the first dummy contact feature and the second dummy contact feature is formed.

* * * * *